(12) United States Patent
Radtke

(10) Patent No.: US 7,714,682 B2
(45) Date of Patent: May 11, 2010

(54) POWER LINE DATA SIGNAL ATTENUATION DEVICE AND METHOD

(75) Inventor: William O. Radtke, Ellicott City, MD (US)

(73) Assignee: Current Technologies, LLC, Germantown, MD (US)

( * ) Notice: Subject to any disclaimer, the term of this patent is extended or adjusted under 35 U.S.C. 154(b) by 341 days.

(21) Appl. No.: 11/766,277

(22) Filed: Jun. 21, 2007

(65) Prior Publication Data
US 2008/0315971 A1 Dec. 25, 2008

(51) Int. Cl.
H04B 3/28 (2006.01)
G05B 11/01 (2006.01)

(52) U.S. Cl. .................... 333/177; 333/12; 340/310.17; 340/538.16

(58) Field of Classification Search ............ 340/310.13, 340/310.17, 538.11, 538.12, 538.16; 307/3, 307/104, 105; 333/12, 177–179, 185
See application file for complete search history.

(56) References Cited

U.S. PATENT DOCUMENTS

| | | |
|---|---|---|
| 3,964,048 A | 6/1976 | Lusk et al. |
| 4,004,257 A | 1/1977 | Geissler |
| 4,683,450 A | 7/1987 | Max et al. |
| 4,766,414 A | 8/1988 | Shuey |
| 4,772,870 A | 9/1988 | Reyes |
| 4,903,006 A | 2/1990 | Boomgaard |
| 5,115,368 A | 5/1992 | Smith |
| 5,355,109 A | 10/1994 | Yamazaki |
| 5,537,087 A | 7/1996 | Naito |
| 5,684,450 A | 11/1997 | Brown |
| 5,777,769 A | 7/1998 | Coutinho |
| 5,870,016 A | 2/1999 | Shresthe |
| 5,952,914 A | 9/1999 | Wynn |
| 6,140,911 A | 10/2000 | Fisher et al. |

(Continued)

FOREIGN PATENT DOCUMENTS

EP      0 141 673 A2    5/1985

(Continued)

OTHER PUBLICATIONS

Hawkins, Bob "Sault Ste. Marie, Canada's First Working BPL Installation", La Revuw des Radioamateurs Canadiens,(Jul. & Aug. 2004),1-4.

(Continued)

*Primary Examiner*—Benny Lee
*Assistant Examiner*—Kimberly E Glenn
(74) *Attorney, Agent, or Firm*—Mel Barnes; Capital Legal Group, LLC

(57) ABSTRACT

A device and method for attenuating high frequency signals on a power line carrying power is provided. In one embodiment the device may include a toroid shaped core formed of magnetically permeable material and having an inner surface to be disposed substantially around the entire circumference of the power line and a winding formed of a conductor that encircles the toroid. The conductor may include a first spiral coil comprised of a plurality of insulated loops such as concentric loops. The first coil is configured to act as an impedance to high frequency signals traversing the conductor and to allow signals below one hundred hertz to traverse the conductor substantially unimpeded to thereby prevent saturation of the core by the power carried by the power line.

31 Claims, 4 Drawing Sheets

U.S. PATENT DOCUMENTS

| | | | |
|---|---|---|---|
| 6,144,292 A | 11/2000 | Brown | |
| 6,172,597 B1 | 1/2001 | Brown | |
| 6,177,849 B1 | 1/2001 | Barsellotti et al. | |
| 6,282,405 B1 | 8/2001 | Brown | |
| 6,297,729 B1 | 10/2001 | Abali et al. | |
| 6,335,672 B1 | 1/2002 | Tumlin et al. | |
| 6,480,510 B1 | 11/2002 | Binder | |
| 6,590,493 B1 | 7/2003 | Rasimas | |
| 6,624,745 B1 | 9/2003 | Willer | |
| 6,667,685 B2 | 12/2003 | Wasaki et al. | |
| 6,771,775 B1 | 8/2004 | Widmer | |
| 6,785,532 B1 | 8/2004 | Rickard | |
| 6,873,239 B2 * | 3/2005 | Decristofaro et al. | 336/178 |
| 6,937,056 B2 | 8/2005 | Binder | |
| 6,952,159 B1 | 10/2005 | Muller | |
| 6,977,578 B2 | 12/2005 | Kline | |
| 7,005,943 B2 | 2/2006 | Cern | |
| 7,053,756 B2 | 5/2006 | Mollenkopf et al. | |
| 7,061,370 B2 * | 6/2006 | Cern | 375/258 |
| 7,105,952 B2 | 9/2006 | Divan et al. | |
| 7,176,786 B2 | 2/2007 | Kline et al. | |
| 2001/0045888 A1 | 11/2001 | Kline | |
| 2002/0075097 A1 | 6/2002 | Brown et al. | |
| 2003/0062990 A1 | 4/2003 | Schaeffer, Jr. et al. | |
| 2003/0179080 A1 | 9/2003 | Mollenkopf et al. | |
| 2003/0224784 A1 | 12/2003 | Hunt et al. | |
| 2004/0085172 A1 | 5/2004 | Cern | |
| 2004/0242185 A1 | 12/2004 | Lee | |
| 2005/0007241 A1 | 1/2005 | Kline | |
| 2005/0057227 A1 | 3/2005 | Rockwell | |
| 2005/0128057 A1 | 6/2005 | Mansfield et al. | |
| 2006/0072621 A1 | 4/2006 | Macaluso et al. | |
| 2006/0139971 A1 | 6/2006 | Suzuki | |
| 2006/0165054 A1 | 7/2006 | Iwamura | |
| 2006/0252405 A1 | 11/2006 | Matz et al. | |
| 2008/0084937 A1 | 4/2008 | Barthold et al. | |
| 2008/0122642 A1 * | 5/2008 | Radtke et al. | 340/660 |

FOREIGN PATENT DOCUMENTS

| | | | |
|---|---|---|---|
| EP | 1 213 849 A1 | 6/2002 | |
| GB | 2 347 601 A | 9/2000 | |
| WO | WO-98/33258 A2 | 7/1998 | |
| WO | WO-02/089352 A1 | 11/2002 | |
| WO | WO-03/039022 A1 | 5/2003 | |

OTHER PUBLICATIONS

"Signalling on Low-Voltage Electrical Installations in the Frequency Band 3kHz to 148.5kHz-Part 4: Filters at the Interface of the Indoor and Outdoor Electricity Network", *CLC SC 105A (Secretariat)*, (May 1992),1-11.

Lim, C K., et al., "Development of a Test Bed for High-Speed Power Line Communications", *School of Electrical and Electronic Engineering, Nanyang Technological University, Singapore, IEEE*, (2000),451-456.

Sado, W N., et al., "Personal Communication on Residential Power Lines-Assessment of Channel Parameters", *IEEE*, (Nov. 1995),532-537.

* cited by examiner

POWER LINE DATA SIGNAL ATTENUATION DEVICE AND METHOD

FIELD OF THE INVENTION

The present invention generally relates to data communications over a power distribution system, and more particularly to a method and device for attenuating data signals communicated over a power line.

BACKGROUND OF THE INVENTION

With some modification, the infrastructure of existing power distribution systems may be used to provide data communication services to customer premises. In a power line communication system (PLCS), existing power lines that already have been run may be used to carry data signals to and from homes, offices, and other structures. These data signals are communicated on and off the power lines at various points in the power line communication system, such as, for example, near homes, offices, Internet service providers, and the like.

Power distribution systems include numerous sections, which conduct power at different voltages. The transition from one section to another typically is accomplished with a transformer. For example, high voltage power transmission lines are converted to medium voltages in the range of 1,000V to 100,000V and may carry 200 amps or more.

The sections of the power distribution system that are connected to the customers premises typically are low voltage (LV) sections having a voltage between 100 volts (Vrms, 60 Hz, or "V") and 240V, depending on the system. In the United States, the LV power lines are about 120V. The transition from an MV section to an LV section of the power distribution system typically is accomplished with a distribution transformer, which converts the higher voltage of the MV section to the lower voltage of the LV section.

Power line communication systems generally communicate over low and/or medium voltage power lines. As power line communications proliferate, there are increasingly more power line communications traversing the power lines among more power line communication devices. A given data signal may traverse an intended path from a source to a destination. However, the same data signal also may traverse additional unintended paths. Thus, some data signals may be received by devices, which are not the intended receiving device (hereinafter the "unintended receiving device"). The reception of data signals by devices that are not the desired receiving device may have one or more undesirable consequences. For example, the unintended receiving device may be contemporaneously receiving data transmitted from another source in the same frequency band. Thus, the unintended data signal will, in essence, be interference (e.g., noise) to the data signals that are intended for the receiving device. As another example, the data signals may be received by the unintended device, which may attempt to demodulate and decrypt the data signal. This may increase latency of communications through the unintended receiving device. Further, in some instances the transmitting device may undesirably receive the transmitted data signal. Security is yet another issue. One adverse effect may be decreased performance of a portion or sub-network of the power line communication system. In summary, data signals received (whether as noise or data) by unintended devices may degrade network performance.

Consequently, there is desire to prevent data signals from being received by unintended devices. One solution is to allocate different frequency bands for each device (e.g., employ a frequency division multiplexed system). However, in many systems this architecture is impossible or impractical. Another solution is to utilize a data signal attenuator device that attenuates data signals. Power line communications employ the existing power lines to provide communications. It is impractical to cut power lines to insert filters for attenuating data signals. Consequently, one well-known means of attenuating data signals is to place a magnetically permeable toroid around the power line, which acts as an inductor thereby attenuating high frequency data signals. However, the power lines carry high voltages and high currents. The high currents of the power lines often saturate the toroid thereby reducing its effectiveness for attenuating data signals. One solution is to make the toroid bigger or to include an air gap to reduce the likelihood of saturation. However, larger toroids, which are typically constructed of ferrite, become too heavy and/or large for practical deployment. Providing an air gap in the toroid simply reduces the effectiveness for attenuating data signals by reducing its inductance.

Accordingly, there is a need for providing a data signal attenuator device that can be utilized without splicing existing power lines, that does not saturate due to the high current carried by the power line, that is sized for practical deployment, and that is economical for wide deployment. One or more of embodiments of the present invention address one or more of these and other needs and provide advantages for power line communication systems.

SUMMARY OF THE INVENTION

The present invention provides device and method for attenuating high frequency signals on a power line carrying power. In one embodiment the device may include a toroid shaped core formed of magnetically permeable material and having an inner surface to be disposed substantially around the entire circumference of the power line and a winding formed of a conductor that encircles the toroid. The conductor may include a first spiral coil comprised of a plurality of insulated loops such as concentric loops. The first coil is configured to act as an impedance to high frequency signals traversing the conductor and to allow signals below one hundred hertz to traverse the conductor substantially unimpeded to thereby prevent saturation of the core by the power carried by the power line.

The invention will be better understood by reference to the following detailed description taken in conjunction with the accompanying drawings.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

Figure 1:
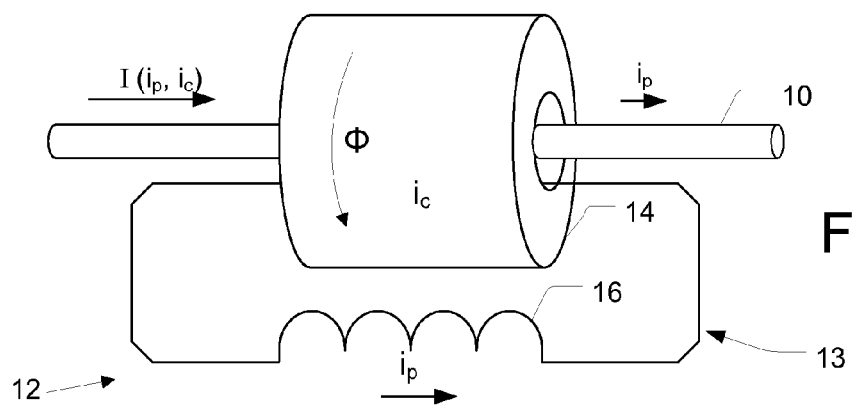
FIG. 1 is a diagram of a data signal attenuator device mounted on a power line according to an example embodiment of the present invention.

In the following description, for purposes of explanation and not limitation, specific details may be set forth, such as particular networks, communication systems, devices, components, techniques, data and network protocols, software, PLCS, hardware, interfaces, etc. in order to provide a thorough understanding of the present invention. However, it will be apparent to one skilled in the art that the present invention may be practiced in other embodiments that depart from these specific details. Detailed descriptions of well-known networks, communication systems, computers, terminals, devices, PLCS, components, techniques, data and network protocols, software products and systems, operating systems, development interfaces, and hardware are omitted so as not to obscure the description of the present invention.

As used herein, "filtering" is meant to refer to the attenuation of a signal or to impede a signal. Consequently, "filtering" is not meant to be limited to (or be equated to) "filtering out" a signal or completely attenuating a signal.

As discussed, it may be desirable to attenuate data signals intentionally, so that they do not interfere with other communications of the PLCS, or so that the data signals do not egress into areas that may interfere with other PLCS networks or sub-networks. Accordingly, the data signals may be attenuated at strategic locations to limit their presence to desired communication paths or desired PLCS sections.

As discussed, one solution for attenuating signals carried along a power line is with a ferromagnetic toroid (e.g., formed of ferrite). A ferromagnetic toroid placed around the power line acts as an inductor to attenuate high frequency signals such as data signals. One challenge to be overcome when using a toroid is saturation. Specifically, when the current traversing through the power line is sufficiently high, the toroid may saturate. When the toroid saturates, such as from a 200 amp 60 Hz medium voltage power line current, the relative permeability of the ferromagnetic material is greatly reduced from its non-saturated condition. This greatly reduces the ability of the toroid core to store signal energy and thus the inductance is correspondingly reduced. Accordingly, when saturated the toroid no longer appears as an inductor or an impedance to attenuate the high frequency data communication signal.

One solution is to use a larger toroid, which typically will increase the amount of current needed to saturate the toroid. For example, the greater the diameter of the toroid, the more magnetic flux that the toroid can handle and the more current that will be needed to saturate the toroid. Another solution is to include an air gap or a larger air gap (a cross-sectional air gap). However, the air gap also reduces the degree of coupling between the toroid and the power line current signals, and therefore also undesirably reduces the effectiveness of the toroid for attenuating high frequency signals.

In contrast to these solutions, one example embodiment of the present invention includes a single turn winding through the toroid that includes an attenuator (e.g., a low pass filter) that allows a 60 hertz signal to be conducted in the winding but that attenuates (e.g., filters) high frequency signals such as frequencies used for communication the PLCS data signals. Embodiments of the present invention also may adopt the other solutions (e.g., increased size; presence or increase of air gap) in conjunction with the winding.

Figure 2:
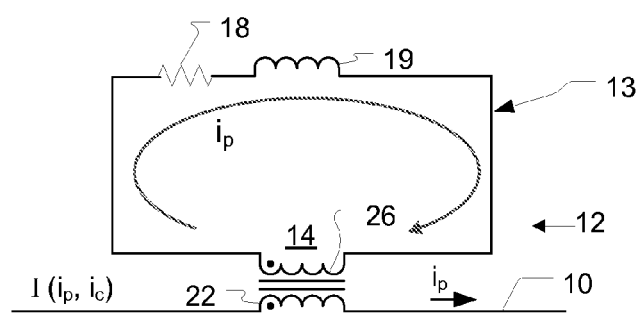
FIG. 2 is a schematic diagram of an attenuator device in accordance with an example embodiment of the present invention.

FIG. 1 depicts a power line 10 and attenuator device 12 according to an example embodiment of the present invention. FIG. 2 is a schematic diagram of the attenuator device of FIG. 1 (without parasitic impedances shown). The power line 10 carries a current signal I which may include a power signal component, $i_p$ (e.g., a 60 hertz power current signal) and a data communication signal current component, $i_c$ (e.g., a high frequency band of carriers used for communications such as, for example, a frequency band with the lowest frequency being greater than one megahertz (MHz), 2 MHz, 4 MHz, 20 MHz, or 30 MHz). The attenuator device 12 may include a winding 13 and a magnetic core that in this embodiment comprises a toroid 14. The winding 13 may include a high frequency impedance 19, (e.g., an inductor) formed, in this embodiment, by a coil 16 (e.g., an radio frequency (RF) choke) that acts as an inductor to impede high frequency signals. As illustrated in FIG. 2, the winding 13 also includes an equivalent resistance 18 (because the winding 13 is not an ideal conductor).

The current I through the power line 10 generates a magnetic flux φ in the toroid 14, which, based on the right-hand rule, induces a current in the winding 13. Specifically, the two components of the current signal I flowing through the power line (specifically $i_p$ and $i_c$) will induce similar current signals (i.e., currents having the same frequency and nearly the same magnitude) in the winding 13. As discussed, however, the inductive coil 16 acts as a low pass filter to permit a 60 hertz signal (corresponding to $i_p$) to flow through the winding 13 but impedes the high frequency signal (corresponding to $i_c$) from flowing through the winding 13. In other words, the winding 13 is substantially a short for 60 Hz signals and a high impedance for high frequencies used for communications signals.

Because the magnetic flux corresponding to the power signal ($i_p$) induces a current in the winding 13, the magnetic field intensity in the toroid 14 is substantially reduced (and in an ideal scenario would approach zero). Further, because the magnetic field caused by the power signal current $i_p$ is largely eliminated from the toroid 14 by the current induced in winding 13, the power signal current $i_p$ through power line does not saturate the toroid 14. In addition, the power signals $i_p$ pass through the attenuator 12 largely unimpeded. The current $i_c$ of the data signals traveling through the power line 10, however, do not induce a current in the winding 13 (or induce only a modest current) because the high frequency impedance 19 (coil 16) impedes the flow of high frequency data signals and, consequently, the whole device 14 acts as an inductor to attenuate high frequency signals. It worth noting that the communications signal current $i_c$ is much, much smaller than the 60 Hz current $i_p$, (e.g., and in some instances may be in the milliamps range) and therefore never gets close to saturating the core.

Thus, the signal I ($i_p$,$i_c$) propagates along the power line 10 to the attenuator device 12, which attenuates the data communication signal component $i_c$ and does not significantly attenuate the power signal component $i_p$. The power signal component $i_p$ flows through the attenuator device 12 and propagates further along the power line 10. In practice the data signal attenuator device 12 will introduce a very small 60 Hz impedance to the power distribution system. This impedance is insignificantly small, and usually equivalent to a few feet (<5') of power line wiring. The effect of this small impedance is a correspondingly small voltage drop caused by the current $i_p$ flowing through the attenuator impedance.

FIG. 2 shows a schematic diagram that illustrates the coupling between the power line 10 and attenuator device 12. The power line 10 serves as a primary winding 22 traversing through the aperture of the toroid 14 through which winding 13 serves as a single turn secondary winding 26. The current induced in the winding 13 by component $i_p$ passes through the high frequency impedance 19 (formed by coil 16), while current is not induced in the winding 13 by component $i_c$ because the high frequency impedance 19 impedes signals of those higher frequencies. Consequently, the current through the winding 13 may be approximately $i_p$. The net effect is that the data signal component $i_c$ is attenuated by the inductance 22 of toroid 14, while the power signal component $i_p$ passes through the toroid 14 substantially unimpeded. In addition, in some embodiments the direction of the turns of the coil may be selected to reduce emissions.

Figure 3:
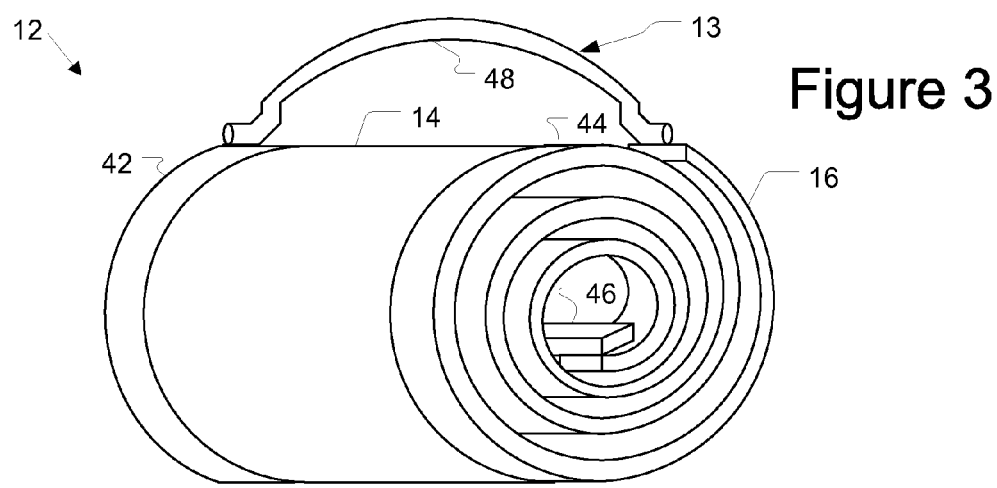
FIG. 3 is an illustration of an example embodiment of an attenuator device in accordance with the present invention.
Figure 4:
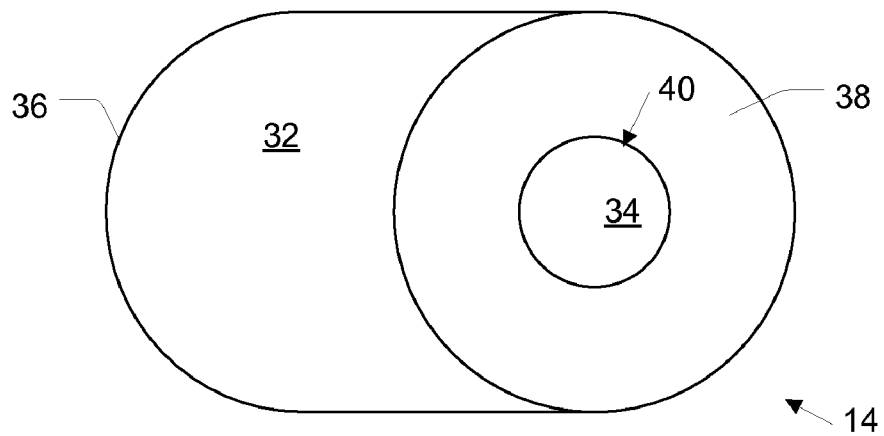
FIG. 4 is an illustration of a toroid of an example embodiment of an attenuator device in accordance with the present invention.
Figure 5:
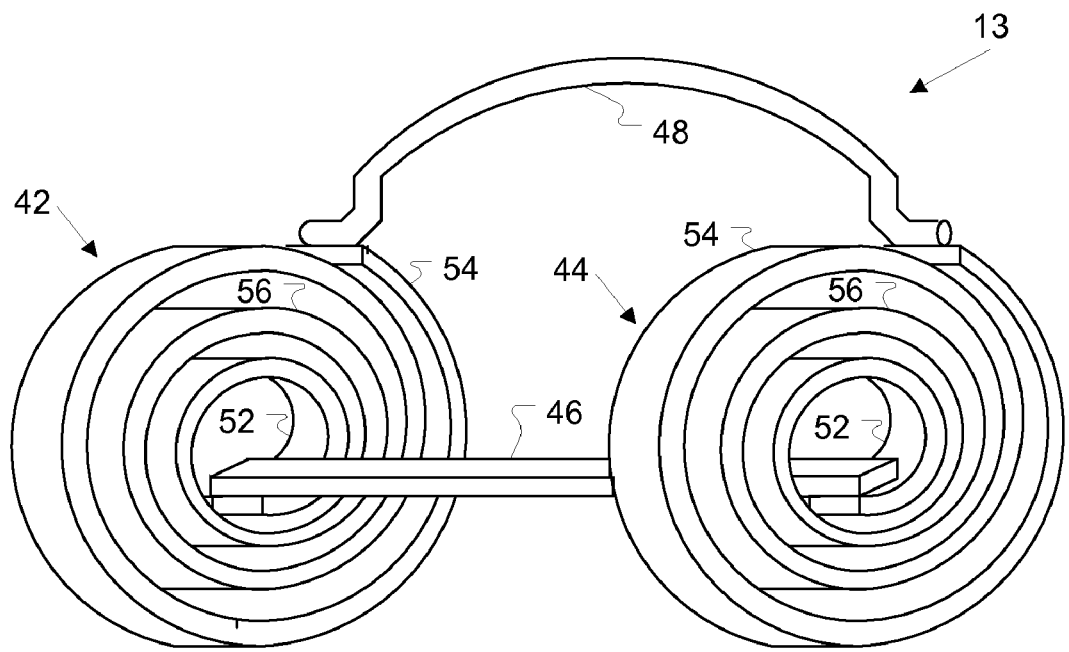
FIG. 5 is an illustration of a winding of an example embodiment of an attenuator device in accordance with the present invention.

FIGS. 3-5 shows an example embodiment of a data signal attenuator device 12 according to the present invention. This example attenuator device 12 includes a magnetically permeable toroid 14 and a winding 13. In one embodiment, such as for an embodiment used with an underground residential distribution (URD) MV power line cable, the toroid 14 may have a cylindrical shape formed with an outer surface 32, an inner surface 34, a first end 36, a second end 38, and a cylindrical aperture 40. The power line 10 traverses through the aperture 40. In a specific embodiment the aperture 40 has a diameter slightly larger than a diameter of the URD cable so that the device 12 may be slipped over the URD cable. The toroid 14 may be formed of a magnetically permeable material, and therefore may comprise a ferrite toroid, an amorphous silicon toroid, a non-crystalline toroid or any other ferromagnetic material. In the present example embodiment, the toroid is formed of a nano-crystalline material. One skilled in the art will recognize that higher relative permeability materials allow for the design of smaller devices with similar and even superior electrical properties. This may result in lower cost, lighter weight, less power dissipation or other design advantages.

Also, while the toroid 14 of the present embodiment is donut shaped (round), other toroid embodiments may include multiple flat sides on the inside surface 34 and/or the outside surface 32 and be, for example, octagon shaped, pentagon shaped, hexagon shaped, or rectangular shaped (while remaining generally cylindrical, with a continuous path around the primary conductor). Other embodiments may include a magnetically permeable core that is not toroidal in shape and, instead, is U-shaped. Other embodiments of the device 12 may include a magnetically permeable core that is disposed sufficiently close to the power line 10 that the shape is less important, meaning that the core may be block shaped and/or designed more for ease of manufacture or installation. Thus, in various embodiments the magnetically permeable core may be shaped and located so as to couple to the magnetic flux caused by the current carried by the data signal and need not be of a particular shape, size, or material.

In one example embodiment of a magnetic toroid 14 used with a URD cable carrying a 200 Amp 60 hertz power signal, the outer diameter of the toroid 14 may be less than 3 inches, the length may be less than 2 inches and the weight may be less than 3 pounds. While a toroid having larger dimensions also may be used, one advantage of the smaller size allows the attenuator device 12 to be installed in locations where space is not available for larger devices such as, for example, in URD transformer enclosures.

FIG. 5 shows an example embodiment of a conductive winding 13 that includes an impedance 19 according to this example embodiment of the present invention. The winding 13 forms a closed circuit and includes an inner conductor 46 configured to extend through the aperture 40 of the toroid 14 (for clarity the toroid 14 is not shown in FIG. 5) and an outer conductor 48 that extends along the outer surface 32 of the toroid 14. In the embodiment illustrated, the winding 13 also includes a first coil 42 located adjacent the first end 36 of the toroid 14 and a second coil 44 located adjacent the second end 38 of the toroid 14. The first coil 42 and the second coil 44 are each formed of a spiral conductor. The spiral formation may include multiple loops (e.g., concentric loops), including an inner loop 52, an outer loop 54 and one or more central loops 56. In an example embodiment, the inner loop 52 may have an inner diameter slightly larger than the diameter of the power line 10 (and substantially the same as the inner surface 34 of the toroid 14). The outer loop 54 may have an outer diameter which is substantially the same as the diameter of the toroid 14. The inner conductor 46 extends through the aperture 40 of the toroid 14 and is connected on each end to the inner loops 52 of the first coil 42 and the second coil 44. The outer conductor 48 extends along the outside of toroid 14 and is connected on each end to the ends of the outer loops 54 of the first coil 42 and the second coil 44.

Each portion of the winding 13 (42, 44, 46, 48) may be formed of a conductor that is sufficient to carry the same amount of current as the power line (e.g., 200 amps). Thus, one challenge of the present invention is providing a winding 13 and inductor 16 that can conduct 200 amps that is also inexpensive and compact because inductors rated for 200 amps are not readily commercially available. In order to achieve the desired inductance, the first and second coils 42, 44 of this embodiment are formed of a conductor having a generally rectangular cross section as shown in FIG. 3 and FIG. 5. The rectangular cross section of the conductor forming each loop is easy to manufacture, and also maximizes the cross-sectional area of the conductor, keeping its 60 Hz resistance low. Each loop of the coils 42, 44 is electrically insulated from the adjacent loops by a dielectric which may be air or any dielectric material. The use of an air-dielectric, which has a relative permittivity of 1 is better than other higher permittivity materials and thus keeps the parasitic winding to winding (or loop to loop) capacitance low. This makes for a better RF inductor (with a sufficiently high Self-Resonant Frequency (SRF)). Thus, each coil 42, 44 may be formed of a dielectrically insulated coil, but generally a lower permittivity is better than a higher one. The spiral inductor is one of several "structures" that can be used to build an inductor. The spiral is used as an example embodiment because it minimizes the space (or envelope) needed for the inductor. For example, a traditional "longitudinal" inductor would use up a significant amount of length and is thus impractical for some implementations.

As discussed, the first coil 42 and the second coil 44 form inductors. Because they are in series, the inductance in winding 13 is the sum of the inductance of the first coil 42 and the second coil 44. In other words, the first coil 42 and the second coil 44 form an inductor that comprises attenuator's 16 series impedance, which in this embodiment forms a low pass filter. In effect the winding 13 is a shorted secondary winding for 60

Hz signals. Because the power signal is at approximately 60 hertz, the effect of such 60 hertz current on the toroid 14 is substantially reduced. Thus, a much greater 60 hertz current signal would be required to saturate the toroid 14 (than if the winding 13 were not present). By avoiding saturation of the toroid 14 by the 60 Hz power signal, the attenuator device 12 retains linear properties irrespective of the current through the power line. By forming the first and second coils 42, 44 as spiral coils located at the ends of the toroid 14, the overall diameter and occupied space of the attenuator 12 may be kept small.

Figure 6:
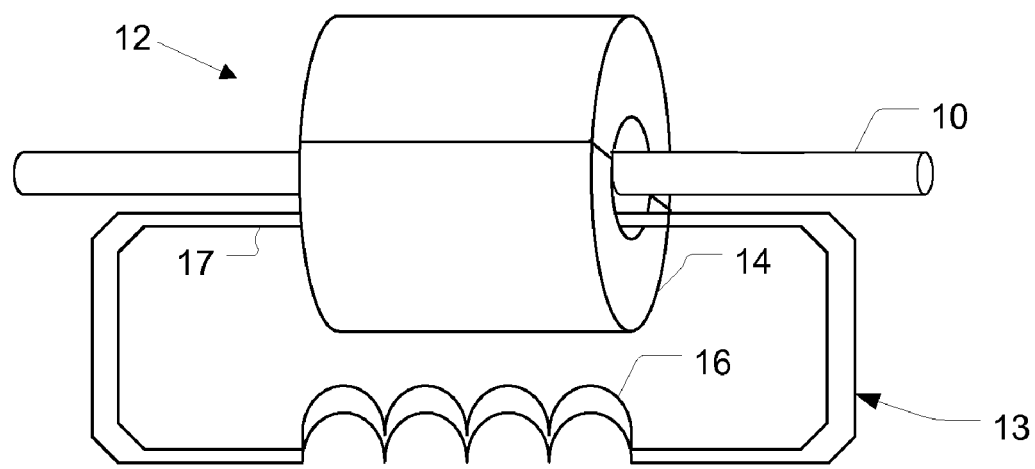
FIG. 6 is a diagram of a data signal attenuator in accordance with another example embodiment of the present invention.

FIG. 6 shows another embodiment of a data signal attenuator 12, such as may be implemented for an overhead power line 10. In this embodiment the magnetic toroid 14 may be formed in two parts which clamp around the power line 10. For such embodiments, the winding 13 may include coils that are located away from the power line 10 (e.g., loops which do NOT encircle the power line). For example, the winding 13 may include a coil 16 that is connected on each to a second portion 17 which runs through the toroid 14. Because overhead power line installations typically do not have the size constraints associated with underground power line installations, the winding 13 and coil 16 of the attenuator device 12 may not need to take the form of the embodiment of FIG. 3.

Figure 7:
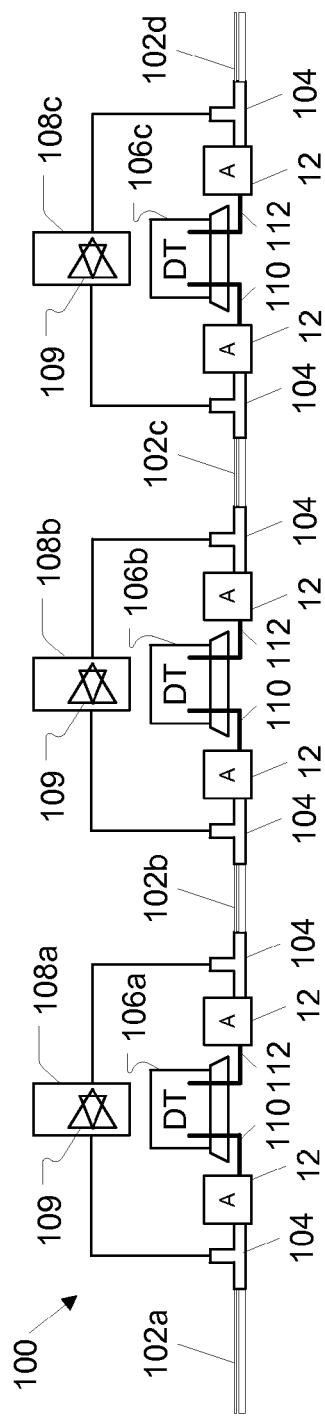
FIG. 7 is a block diagram of a portion of an example PLCS illustrating one application of an attenuator device, in accordance with an example embodiment of the present invention.
Figure 8:
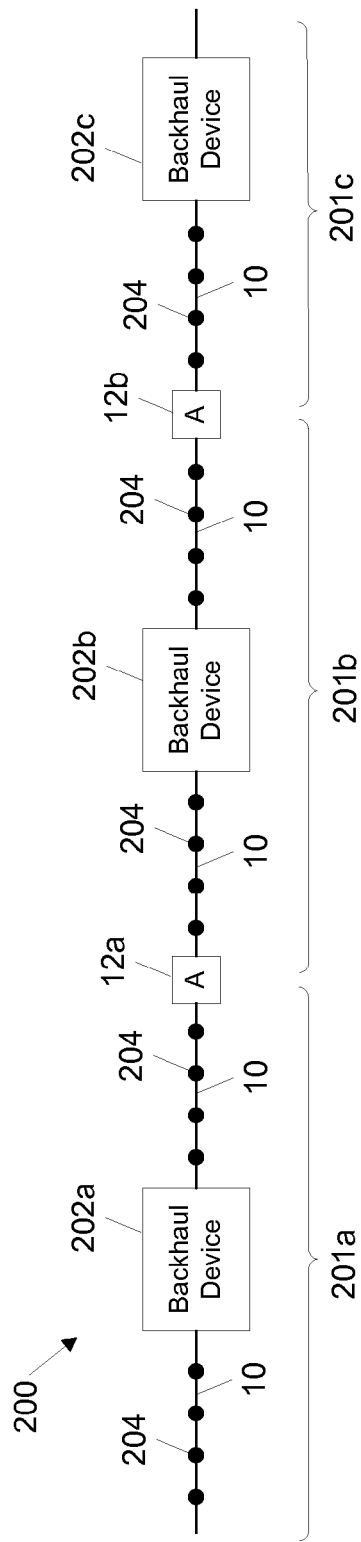
FIG. 8 is a block diagram of another example PLCS illustrating another application of an attenuator device, in accordance with an example embodiment of the present invention.

FIGS. 7 and 8 show implementations of the data signal attenuator 12 in a portion of a power line communication system (PLCS). Detailed descriptions of the components, features, and power line communication devices of some example underground PLCSs are provided in U.S. Pat No. 7,450,000 issued on Nov. 11, 2008 entitled, "Power Line Communications Device and Method," which is incorporated herein by reference in its entirety.

For some commercial and residential developments, portions of the power distribution system are underground. Typically, a medium voltage underground residential delivery (URD) cable may comprise a plurality of segments that are coupled to a plurality of distribution transformers located at intervals along the underground MV URD cable. A bypass device (e.g., a PLCD) may be located at one or more distribution transformers to receive a power line communications from one segment of URD cable. In some embodiments, the bypass device may amplify data signals received from one side of a distribution transformer and couple the amplified signal onto another segment of the URD cable at the other side of the distribution transformer to ensure continued propagation of the communication in the direction of an intended destination.

FIG. 7 depicts utilization of a data signal attenuator device 12 in an underground PLCS 100. This example underground PLCS 100 includes multiple MV URD cable segments 102 and multiple power line communication devices (e.g., such as formed by power line bridges 108) located in the vicinity of corresponding distribution transformers 106. Each MV URD segment 102 is connected to a different distribution transformer 106 on each end.

In this embodiment, each PLCD 108 is coupled to the two MV URD segments 102 connected to its associated distribution transformer via a first and second coupler 104. The PLCD 108 allows the data signals to couple around the distribution transformer 106 with which it may be co-located. The couplers 104 allow the data signal to be coupled to and from the power line 102 while preventing the high voltage power signal from being conducted to the PLCD 108. As shown in this example, each attenuator device 12 is installed between a coupler 104 and the elbow 110 (or elbow 112) that connects the MV URD segment 102 to the distribution transformer 106. Such deployment prevents data signal transmitted by a PLCS 108 from one coupler 104a, from traversing through the distribution transformer 106 and being received by the other coupler 104b, and processed by the PLCD 108. Such a "feedback loop" is undesirable as would be obvious to those skilled in the art. In the absence of attenuator devices 12 on one or both sides of a given distribution transformer 106, data communication signals could propagate in each direction from each coupler 104 and traverse both of the MV URD cable segments 102 attached to the distribution transformer 106. Detailed descriptions of example power line coupling devices with which the present invention may be used or integrated are provided in U.S. Pat. No. 7,245,201 issued on Jul. 17. 2007 entitled, "Power Line Coupling Device and Method of Using the Same," which is incorporated herein by reference in its entirety.

FIG. 8 shows another deployment of an attenuator device 12 for use with either of an underground or overhead PLCS 200. In this implementation, the attenuator device 12 is installed to isolate respective subnets 201a 201b, and 201c of the PLCS 200 from each other. In particular, data communication signals from one subnet (e.g., 201b) of the PLCS 200 are prevented from inadvertently propagating to another subnet (e.g., 201a; 201c) of the PLCS network 200. For example, a data signal transmitted from (or to) a PLCD 204 and backhaul device 202b of subnet 201b may be attenuated by attenuator device 12a and/or 12b to thereby prevent reception of (or interference by) the data signal by the PLCDs 204 and/or the backhaul device 202a,c of nearby subnets 201a and 201c. For installation on URD power lines, the elbow of the power line may be removed, the attenuator device slid on to the power line, and the elbow replaced. In some embodiments, it also may be desirable to peal back or remove the external neutral conductor of the power line.

Thus, signals may propagate indefinitely in either direction as they become progressively attenuated. These attenuated signals may result in interference with other power line data communication signals and degrade the PLCS performance. By including an attenuator device 12 at strategic locations (e.g., between subnets) to thereby isolate respective subnets of the PLCS 200, PLCS communications may be improved.

In another embodiment, the attenuator device may be installed at or near location where low voltage or other power lines enter a customer premise (e.g., a home, apartment building, hotel, office building, retail space, etc.) to isolate an internal power line local area network from an external PLC system (e.g., an external wide area network that uses the power lines).

Because the current through the winding 13 may approximate the 60 Hz current of the power signal carried by the power line 10, some embodiments may also include a sensor that measures the current through the winding 13, via a Rogowski coil or hall effect sensor. The data of this measurement may be transmitted via the PLCS to the utility.

Other embodiments of the attenuator device of the present invention may function as an inductive coupler to couple data signals onto and off of the power line 10. For example, an additional winding (in addition to winding 13) may be wound through and around the toroid 14 one or more turns. The ends of the additional winding may be coupled to a transmitter and/or receiver (e.g., a modem or a transceiver). Alternately, in another embodiment a transmitter and/or receiver could be connected to the winding 13 on each side of the coil 16.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A device for attenuating high frequency communication signals on a power line, comprising:
    a toroid shaped core formed of magnetically permeable material and having an inner surface to be disposed substantially around the entire circumference of the power line;
    a conductive winding encircling said core and traversing an aperture of said core;
    wherein said winding includes a first spiral coil comprised of a plurality of insulated loops;
    said core has a first end and said first coil is disposed adjacent said first end of said core; and
    wherein said first spiral coil is configured to act as an impedance to high frequency signals traversing said winding and to allow signals below one hundred hertz to traverse said winding substantially unimpeded to thereby prevent saturation of the core by power carried by the power line.

2. The device of claim 1, wherein said conductive winding includes a second spiral shaped coil having a plurality of insulated loops.

3. The device of claim 2, wherein:
    said core has a second end; and
    said second coil is disposed adjacent said second end of said core.

4. The device of claim 1, wherein said first coil is formed of a conductor having a substantially rectangular cross section.

5. The device of claim 1, wherein said core is configured to be mounted to the power line adjacent a power line coupling mechanism to attenuate data signals on only one side of said coupling mechanism.

6. The device of claim 1, wherein the power line comprises an insulated underground power line.

7. The device of claim 1, wherein the power line comprises an uninsulated overhead power line.

8. The device of claim 1, wherein the device is configured to attenuate signals above thirty megahertz.

9. The device of claim 1, wherein said core has an outer surface and said first coil includes an outer spiral loop having an outside substantially co-planer with said outer surface.

10. A device for attenuating high frequency communication signals traversing a power line, comprising:
    a core formed of magnetically permeable material and having an aperture configured to receive a power line;
    wherein said core is configured to attenuate high frequency signals traversing the power line;
    a conductive winding wound around said core and through said aperture; and
    wherein said winding includes a first spiral shaped coil having a plurality of substantially concentric loops disposed in a single plane.

11. The device of claim 10, wherein said winding includes a second spiral shaped coil comprised of a plurality of substantially concentric loops.

12. The method of claim 11, wherein:
    said core is toroidal in shape and has first end and a second end;
    said first coil is disposed adjacent said first end of said core; and
    said second coil is disposed adjacent said second end of said core.

13. The device of claim 10, wherein said core is toroidal in shape and has an outer surface and said first coil has an outer loop having an outer side substantially co-planer with said outer surface.

14. The device of claim 10, wherein said first coil includes a center loop having an inside surface configured to be disposed around the power line.

15. The device of claim 10, wherein said first coil is configured to act as an impedance to high frequency signals traversing said winding and to allow signals under one hundred hertz to traverse said winding substantially unimpeded.

16. The device of claim 10, wherein said first coil is formed of a conductor having a substantially rectangular cross section.

17. The device of claim 10, wherein said device is configured to be mounted to the power line adjacent a power line coupling mechanism to attenuate data signals on the power line on only one side of said coupling mechanism.

18. The device of claim 10, wherein said core is configured to be slid on to an underground power line cable.

19. A method of attenuating high frequency signals on a power line, comprising:
    selecting a location on the power line for attenuating high frequency signals;
    installing a magnetically permeable core around the entire circumference of the power line at the selected location;
    wherein said core is configured to attenuate high frequency signals traversing the power line;
    providing a conductive winding wound around said core and through an aperture of said core,
    wherein said winding includes a low pass filter configured to allow signals below one hundred hertz to traverse said winding substantially unimpeded and to attenuate high frequency signals; and
    concurrently attenuating high frequency signals traversing the power line while inducing a current in the conductive winding from the power line.

20. The method of claim 19, wherein said winding includes a first spiral shaped coil having a plurality of substantially concentric loops disposed in a plane.

21. The method of claim 20, wherein:
    said winding includes a second spiral shaped coil having a plurality of substantially concentric loops;
    said core has first end and a second end;
    said first coil is disposed adjacent said first end of said core and around the power line; and
    said second coil is disposed adjacent said second end of said core and around the power line.

22. The method of claim 19, wherein said low pass filter comprises a first coil formed of a conductor having a substantially rectangular cross section.

23. The method of claim 19, wherein the power line comprises an insulated underground power line.

24. The method of claim 19, wherein the power line comprises an uninsulated overhead power line.

25. The method of claim 19, wherein said core is configured to attenuate signals above thirty megahertz.

26. The method of claim 19, wherein said core has an outer surface and said low pass filter comprises a first coil that includes an outer spiral loop having an outside substantially co-planer with said outer surface.

27. The method of claim 19, wherein said core has a first end and said low pass filter comprises a first coil that is disposed adjacent said first end of said core.

28. The method of claim 19, wherein said installing said core comprises installing said core on the power line adjacent a power line coupling mechanism to attenuate data signals on only one side of said coupling mechanism.

29. The method of claim 19, wherein said core forms part of a coupling device and said installing said core on the power line comprises mounting said coupling device on the power line and wherein said core is configured to attenuate data signals on only one side of a coupling mechanism of said coupling device.

30. The method of claim 19, wherein said installing said core comprises: removing an elbow of the power line; then subsequently disposing the core around the power line; and subsequently installing the elbow on the power line.

31. The method of claim 19, wherein said core is formed of a nano-crystaline material.

* * * * *